(12) United States Patent
Kuo et al.

(10) Patent No.: US 11,349,188 B2
(45) Date of Patent: May 31, 2022

(54) ELECTRONIC DEVICE

(71) Applicant: HTC Corporation, Taoyuan (TW)

(72) Inventors: Chih-Yao Kuo, Taoyuan (TW);
Chin-Kai Sun, Taoyuan (TW);
Chung-Chiao Tan, Taoyuan (TW);
Wei-Cheng Liu, Taoyuan (TW)

(73) Assignee: HTC Corporation

( * ) Notice: Subject to any disclaimer, the term of this patent is extended or adjusted under 35 U.S.C. 154(b) by 106 days.

(21) Appl. No.: 17/013,878

(22) Filed: Sep. 8, 2020

(65) Prior Publication Data
US 2021/0265718 A1    Aug. 26, 2021

Related U.S. Application Data

(60) Provisional application No. 62/981,539, filed on Feb. 26, 2020.

(51) Int. Cl.
*H01Q 1/02* (2006.01)
*H01Q 1/22* (2006.01)
*H05K 7/20* (2006.01)

(52) U.S. Cl.
CPC ............. *H01Q 1/02* (2013.01); *H01Q 1/22* (2013.01); *H05K 7/20136* (2013.01)

(58) Field of Classification Search
None
See application file for complete search history.

(56) References Cited

U.S. PATENT DOCUMENTS

| 2011/0108251 A1 | 5/2011 | Horng | |
| 2012/0301281 A1 | 11/2012 | Wang | |
| 2014/0168893 A1* | 6/2014 | Niu | H04B 1/036 361/692 |
| 2014/0235156 A1* | 8/2014 | Li | G06F 1/203 454/184 |
| 2018/0006354 A1* | 1/2018 | Nivet | H01Q 1/02 |
| 2018/0298921 A1* | 10/2018 | Niemann | F28F 3/04 |

FOREIGN PATENT DOCUMENTS

| JP | 2006332835 | 12/2006 |
| JP | 2008121627 | 5/2008 |
| JP | 2012083860 | 4/2012 |
| TW | M408912 | 8/2011 |
| TW | I423014 | 1/2014 |
| TW | M491870 | 12/2014 |
| WO | 2018123119 | 7/2018 |

OTHER PUBLICATIONS

"Office Action of Taiwan Counterpart Application", dated Feb. 4, 2021, p. 1-p. 7.
"Office Action of Japan Counterpart Application", dated Aug. 24, 2021, p. 1-p. 3.
"Office Action of Japan Counterpart Application", dated Mar. 8, 2022, p. 1-p. 4.

* cited by examiner

*Primary Examiner* — Mukundbhai G Patel
(74) *Attorney, Agent, or Firm* — JCIPRNET (57) ABSTRACT

An electronic device includes a casing, a fan base, a fan side wall and an impeller. The casing has a fan top wall. The fan top wall has an airflow inlet. The fan base is provided in the casing. The fan side wall extends from the casing or the fan base. The fan top wall, the fan base and the fan side wall define a fan space communicated with the airflow inlet and a first airflow outlet communicated with the fan space. The impeller is mounted at the fan base and is located in the fan space.

14 Claims, 7 Drawing Sheets

ELECTRONIC DEVICE

CROSS-REFERENCE TO RELATED APPLICATION

This application claims the priority benefit of U.S. provisional application Ser. No. 62/981,539, filed on Feb. 26, 2020. The entirety of the above-mentioned patent application is hereby incorporated by reference herein and made a part of this specification.

BACKGROUND

Field of the Disclosure

The disclosure relates to an electronic device, and particularly relates to an electronic device with a fan.

Description of Related Art

Fan modules are often applied as airflow supply components as a means for active heat dissipation. The components of the conventional fan module are typically made of metal or plastic materials. When the conventional fan module is directly mounted in an electronic product, the size (for example, thickness) of the casing of the electronic product is usually increased. In addition, when the conventional fan module is applied to an electronic product with an antenna module, if the fan module and the antenna module are too close to each other, the metal component of the fan module will affect the performance of the antenna module. In order to maintain the performance of the antenna module, the fan module needs to be configured far away from the antenna module, thus increasing the size of the electronic product in appearance.

SUMMARY OF THE DISCLOSURE

The disclosure provides an electronic device which provides good self heat dissipation performance and has a smaller size in appearance.

An electronic device of the disclosure includes a casing, a fan base, a fan side wall and an impeller. The casing has a fan top wall. The fan top wall has an airflow inlet. The fan base is provided in the casing. The fan side wall extends from the casing or the fan base. The fan top wall, the fan base and the fan side wall define a fan space communicated with the airflow inlet and a first airflow outlet communicated with the fan space. The impeller is mounted at the fan base and is located in the fan space.

Based on the above, in the disclosure, the casing has a fan top wall (that is, the fan top wall is directly formed by a part of the casing), and the fan side wall extends from the casing or the fan base (that is, the fan side wall is directly formed by a part of the casing or a part of the fan base). Therefore, some components of the fan module can be formed by using the components of the electronic device itself, which helps to reduce the size of the electronic device in appearance.

DESCRIPTION OF EMBODIMENTS

Please refer to FIG. 1 to FIG. 5. In this embodiment, the electronic device 100 is, for example, a network router, a smart phone, a tablet PC or a notebook computer etc. The electronic device 100 includes a casing 110, a fan base 120, a fan side wall 130 and an impeller 140. The casing 110 has a fan top wall 110a. The fan top wall 110a has an airflow inlet AI. The fan base 120 is provided in the casing 110. The fan side wall 130 may directly extend from the casing 110, which means that the fan side wall 130 can be integrally formed with the casing 110. In another embodiment, the fan side wall 130 may directly extend from the fan base 120, which means that the fan side wall 130 and the fan base 120 may be formed integrally.

Please refer to FIG. 1 to FIG. 5, in this embodiment, the fan top wall 110a, the fan base 120, and the fan side wall 130 define a fan space FS communicating with the airflow inlet AI and a first airflow outlet AO1 communicating with the fan space FS. The impeller 140 is mounted at the fan base 120 and is located in the fan space FS.

Please refer to FIG. 1 to FIG. 5. In this embodiment, the casing 110 may include an upper casing 112 and a lower casing 114 connected to the upper casing 112. The fan side wall 130 extends from the upper casing 112. Specifically, the upper casing 112 may include an upper bezel 112a, a part of the upper bezel 112a may constitute the fan top wall 110a, and the fan side wall 130 may extend from the upper bezel 112a. The upper casing 112 may further include an upper cover 112b mounted at the upper bezel 112a, and the fan side wall 130 may extend from the upper bezel 112a. The upper bezel 112a may have an airflow inlet AI, the upper cover 112b may have a plurality of openings 112b-1, and these openings 112b-1 may communicate with the airflow inlet AI. The impeller 140 can introduce the air outside the casing 110 into the fan space FS through these openings 112b-1 and the airflow inlet AI, and drive the airflow to be outputted through the first airflow outlet AO1. A part of the upper bezel 112a (that is, a part of the casing 110), the fan base 120, the fan side wall 130 and the impeller 140 can form a fan. Compared with directly disposing an independent and complete conventional fan module in the electronic device 100 and increase the overall thickness of the electronic device 100, the overall thickness of the electronic device 100 of this embodiment can be reduced.

Please refer to FIG. 2 to FIG. 5. In this embodiment, the lower casing 114 may include a lower bezel 114a and a lower cover 114b mounted on the lower bezel 114a.

Figure 1:
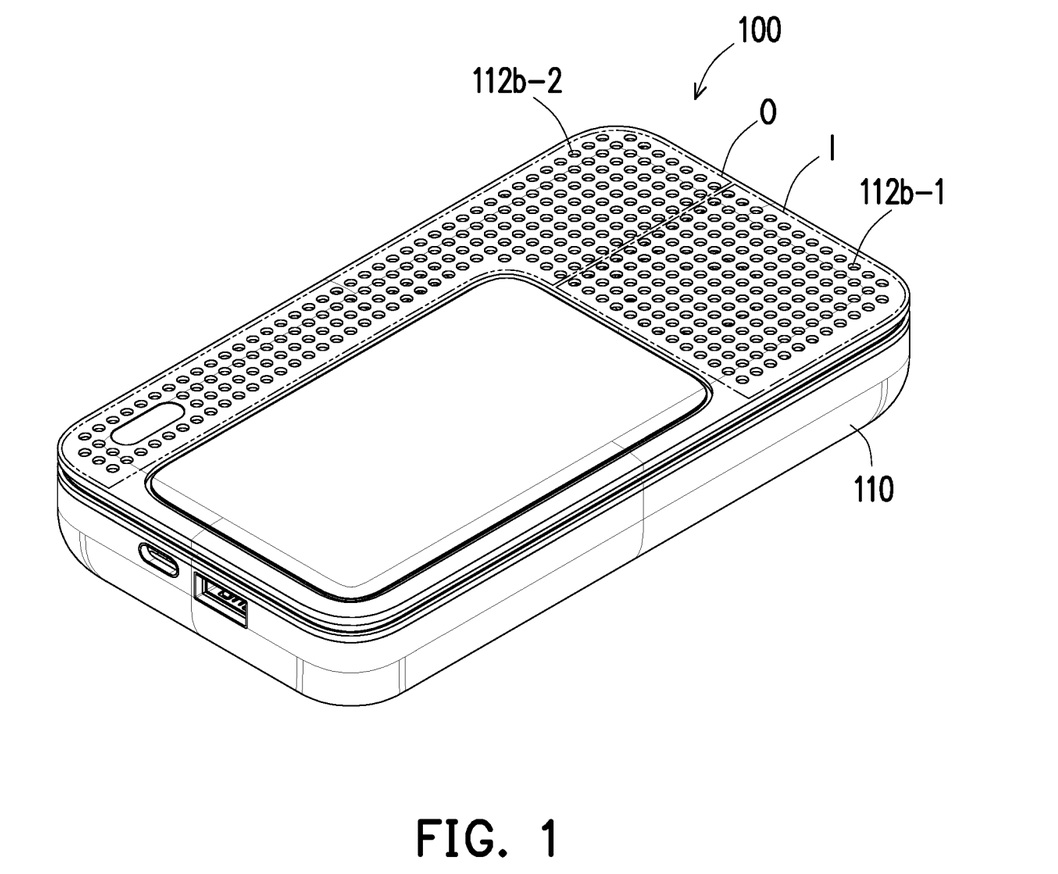
FIG. 1 is a perspective top view of an electronic device according to an embodiment of the disclosure.
Figure 2:
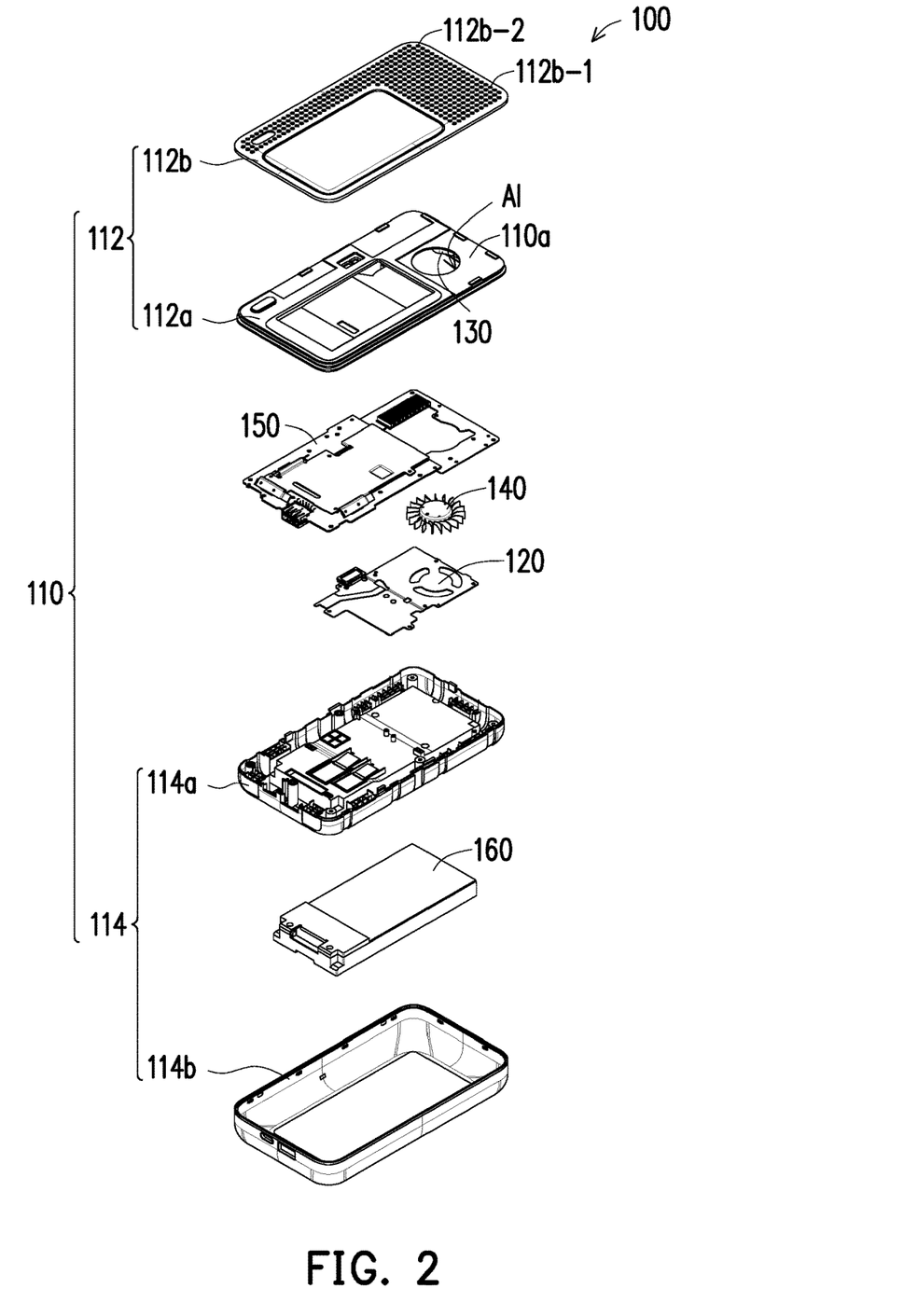
FIG. 2 is a perspective exploded top view of the electronic device of FIG. 1.
Figure 3:
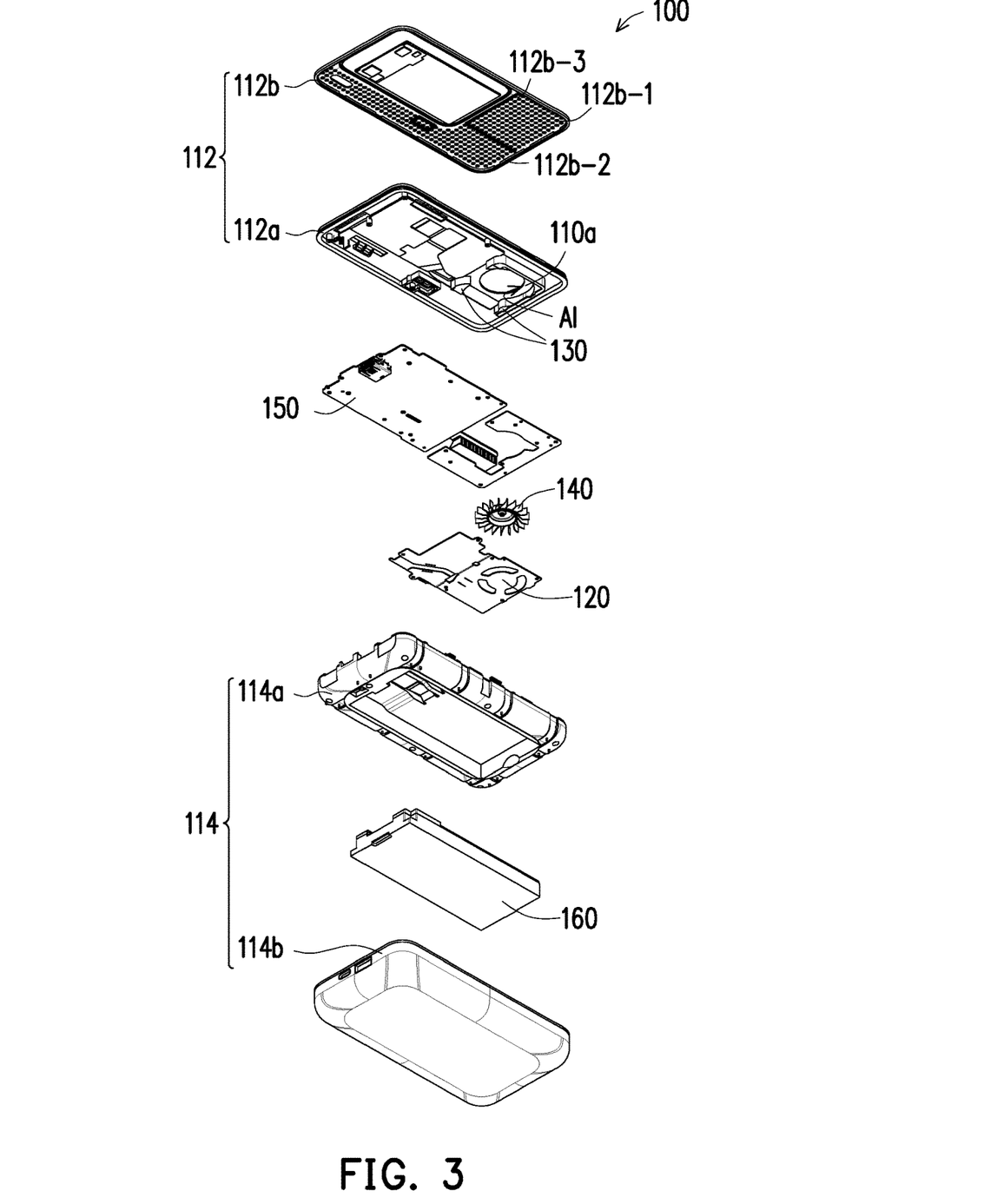
FIG. 3 is a perspective exploded bottom view of the electronic device of FIG. 1.

Please refer to FIG. 1 to FIG. 3, in this embodiment, the upper cover 112b may further have a plurality of openings 112b-2 to allow the airflow in the casing 110 to be discharged. As shown in FIG. 1, these openings 112b-1 are located in the intake region I, and these openings 112b-2 are located in the discharge region O. The intake region I and the discharge region O are separated by the partition wall 112b-3 in FIG. 3.

Please refer to FIG. 2 to FIG. 5, in this embodiment, the material of the fan base 120 may be metal to improve heat dissipation efficiency. In addition, a part of the fan base 120 that extends beyond the fan side wall 130 may serve as a heat dissipation component to improve heat dissipation efficiency.

Figure 4:
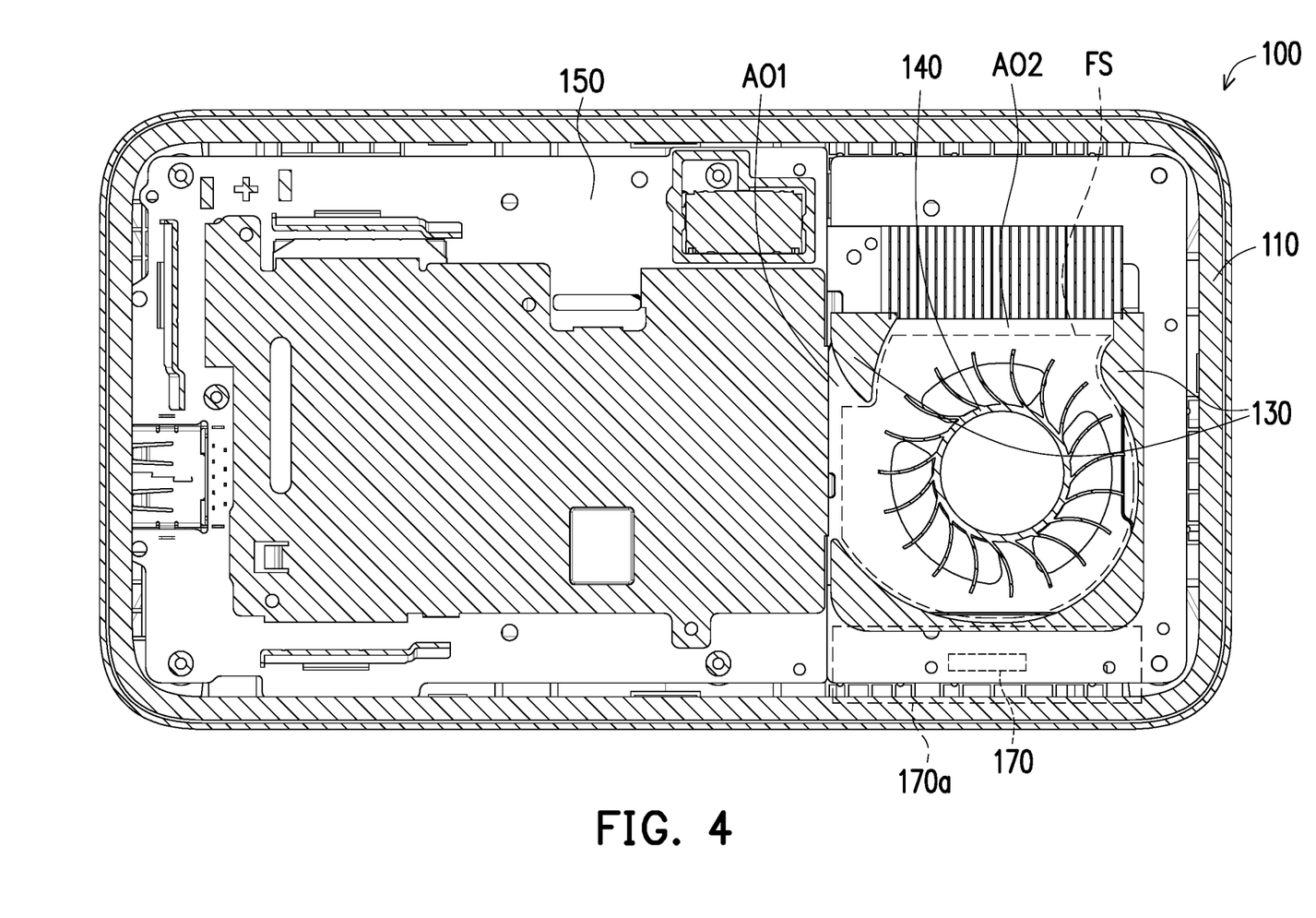
FIG. 4 is a lateral cross-sectional view of the electronic device of FIG. 1 passing through its fan side wall.
Figure 5:
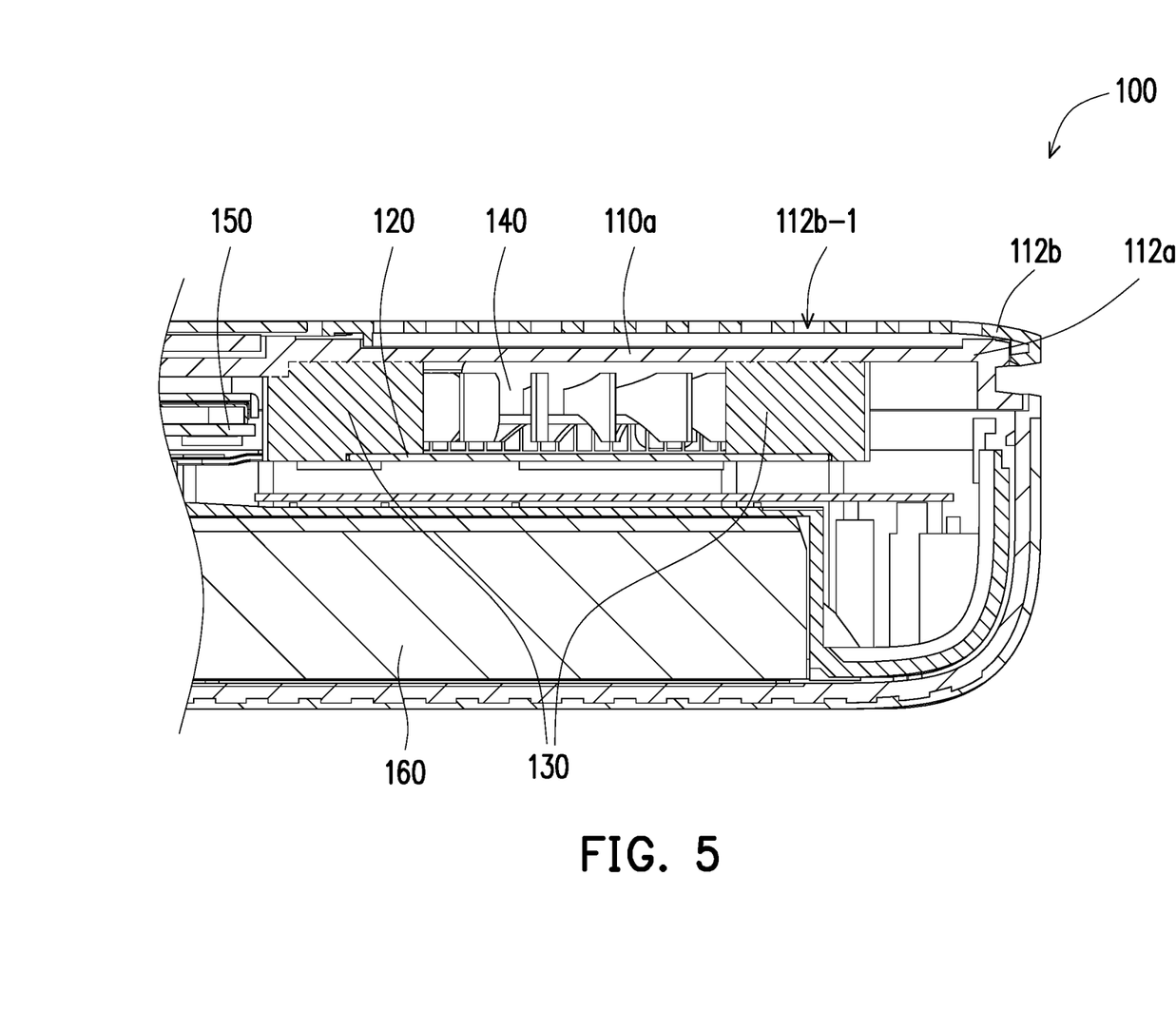
FIG. 5 is a partial longitudinal cross-sectional view of the electronic device of FIG. 1 passing through its fan side wall.

Please refer to FIG. 2 to FIG. 5, in this embodiment, the fan top wall 110a, the fan base 120, and the fan side wall 130 may further define a second airflow outlet AO2 communicating with the fan space FS, as shown in FIG. 4. The second airflow outlet AO2 is adjacent to the part of the fan base 120 that extends beyond the fan side wall 130 to improve heat dissipation efficiency.

Please refer to FIG. 2 and FIG. 3, in this embodiment, the electronic device 100 may further include a motherboard 150 and a battery 160. The motherboard 150 is arranged in the casing 110 to control other components. The battery 160 is disposed in the casing 110 (for example, between the lower bezel 114a and the lower cover 114b of the lower casing 114) to supply power.

Please refer to FIG. 4, in this embodiment, the electronic device 100 may further include one or more antenna modules 170, such as mmWave modules. The antenna module 170 is disposed in the casing 110 and has an antenna clearance region 170a. A part of the fan side wall 130 may be located in the antenna clearance region 170a. For example, the material of the fan side wall 130 may be a material that has a small effect on the performance of the antenna module. For example, the material of the fan side wall 130 can be plastic or other non-metal materials, so that the fan side wall 130 can be located in the antenna clearance region 170a, and has decreased effect on the performance of the antenna module 170. In this manner, the size of such an electronic device 100 can be smaller.

In another embodiment, the plastic part or non-metal material part of the fan side wall 130 may be located in the antenna clearance region 170a, while the metal part of the fan side wall 130 is not located in the antenna clearance region 170a. In another embodiment, the plastic part or the non-metal material part of the fan base 120 may be located in the antenna clearance region 170a, while the metal part of the fan base 120 is not located in the antenna clearance region 170a.

Figure 6:
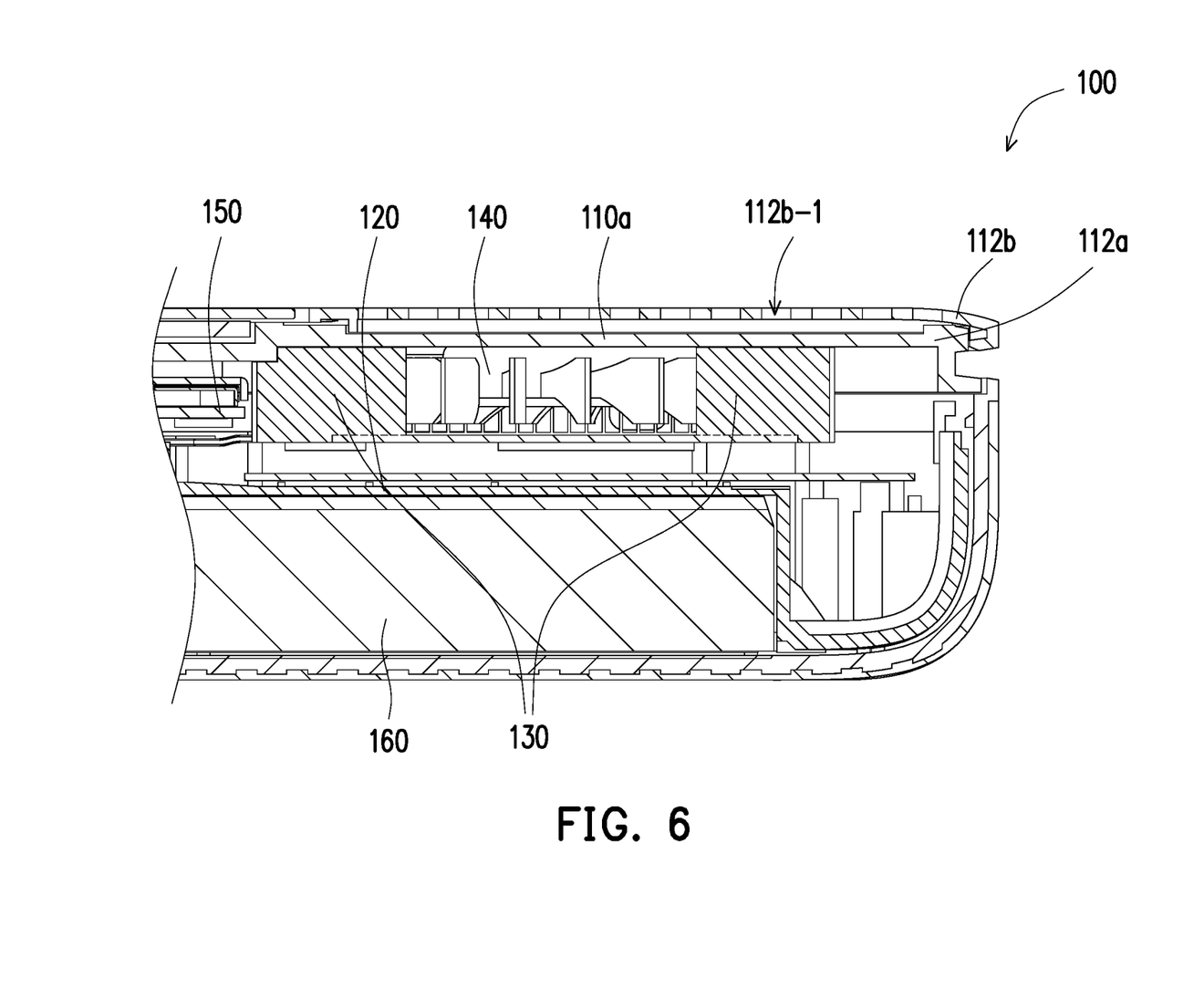
FIG. 6 is a partial longitudinal cross-sectional view of a fan side wall of an electronic device extending from the upper cover of the upper casing according to another embodiment of the disclosure.

Please refer to FIG. 6, in another embodiment, the fan side wall 130 can directly extend from the upper cover 112b, which means that the fan side wall 130 can be integrally formed with the upper cover 112b. The fan top wall 110a may be formed by a part of the upper cover 112b. The fan top wall 110a may have multiple airflow inlets AI.

Figure 7:
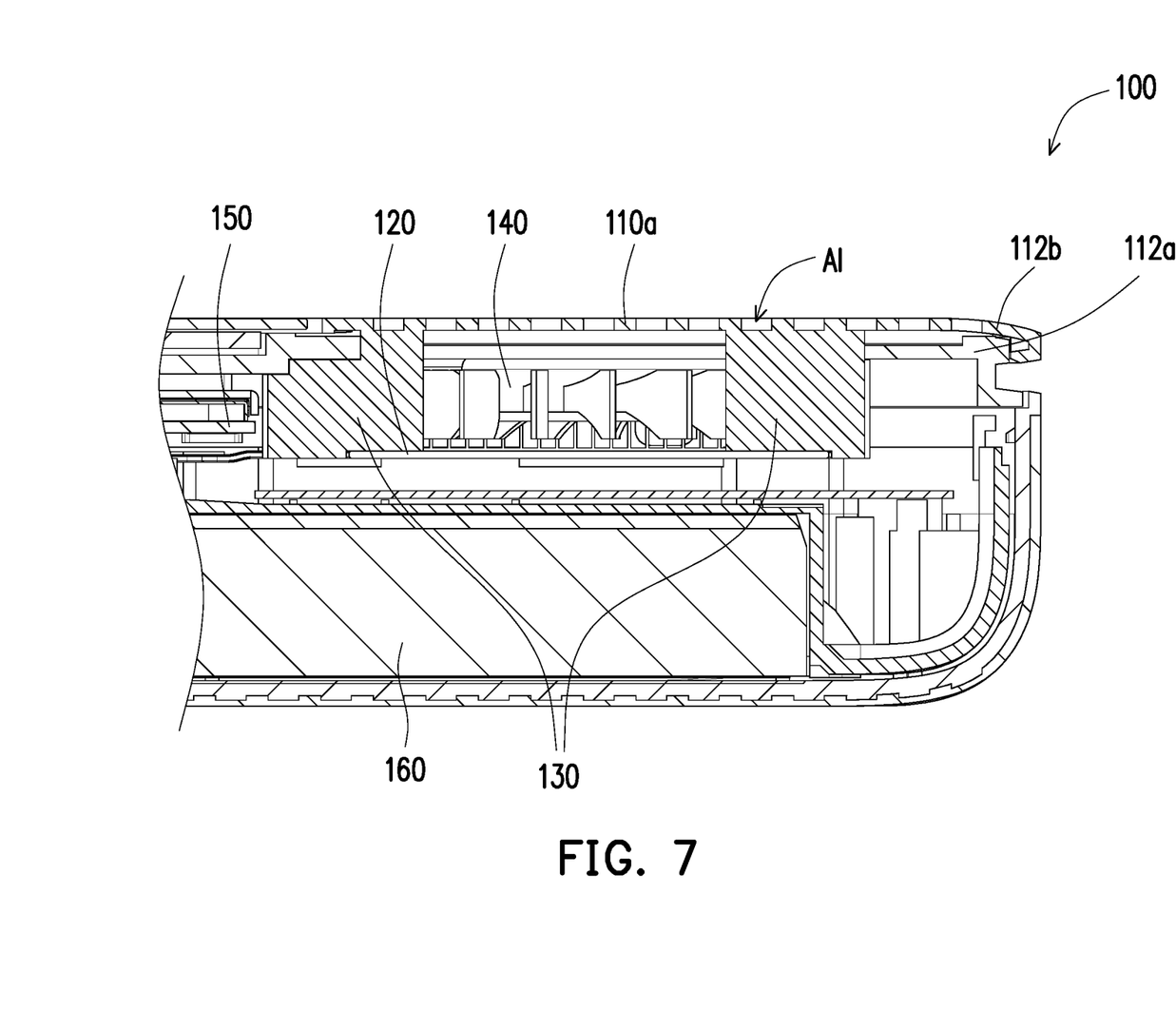
FIG. 7 is a partial longitudinal cross-sectional view of a fan side wall of an electronic device extending from a fan base according to still another embodiment of the disclosure.

Please refer to FIG. 7, in another embodiment, the fan side wall 130 may directly extend from the fan base 120, which means that the fan side wall 130 and the fan base 120 may be formed integrally. The fan top wall 110a may be formed by a part of the fan side wall 130.

In summary, in the disclosure, the casing has a fan top wall (that is, the fan top wall is directly formed by a part of the casing), and the fan side wall extends from the casing or the fan base (the fan side wall is directly formed by a part of the casing or a part of the fan base). Therefore, some components of the fan module can be formed by the components of the electronic device itself, which helps to reduce the size of the electronic device in appearance.

What is claimed is:

1. An electronic device, comprising:
    a casing having a fan top wall, wherein the fan top wall has an airflow inlet;
    a fan base arranged in the casing;
    a fan side wall extending from the casing or the fan base, wherein the fan top wall, the fan base and the fan side wall define a fan space communicating with the airflow inlet and a first airflow outlet communicating with the fan space;
    an impeller mounted on the fan base and located in the fan space; and
    an antenna module arranged in the casing and having an antenna clearance region, wherein a part of the fan side wall is located in the antenna clearance region.

2. The electronic device according to claim 1, wherein the casing comprises an upper casing and a lower casing connected with the upper casing.

3. The electronic device according to claim 2, wherein the fan side wall extends from the upper casing.

4. The electronic device according to claim 2, wherein the upper casing comprises an upper bezel, and the fan side wall extends from the upper bezel.

5. The electronic device according to claim 2, wherein the upper casing comprises an upper bezel and an upper cover mounted on the upper bezel, and the fan side wall extends from the upper bezel.

6. The electronic device according to claim 2, wherein the upper casing comprises an upper bezel and an upper cover mounted on the upper bezel, and the fan side wall extends from the upper cover.

7. The electronic device according to claim 2, wherein the upper casing comprises an upper bezel and an upper cover mounted on the upper bezel, a part of the upper bezel forms the fan top wall, the upper cover has a plurality of openings, and the openings communicate with the airflow inlet.

8. The electronic device according to claim 2, wherein the lower casing comprises a lower bezel and a lower cover mounted on the lower bezel.

9. The electronic device according to claim 2, wherein the casing has a gap, and the gap is located at a junction of the upper casing and the lower casing to allow airflow to flow out of the casing.

10. The electronic device according to claim 1, wherein a part of the fan base extending beyond the fan side wall serves as a heat dissipation component.

11. The electronic device according to claim 1, wherein the fan top wall, the fan base and the fan side wall define a second airflow outlet communicating with the fan space.

12. The electronic device according to claim 11, wherein the second airflow outlet is adjacent to a part of the fan base that extends beyond the fan side wall.

13. The electronic device according to claim 1, wherein the antenna module is a mmWave module.

14. The electronic device according to claim 1, wherein a material of the part of the fan side wall comprises plastic.

* * * * *

UNITED STATES PATENT AND TRADEMARK OFFICE
CERTIFICATE OF CORRECTION

| | | |
|---|---|---|
| PATENT NO. | : 11,349,188 B2 | Page 1 of 1 |
| APPLICATION NO. | : 17/013878 | |
| DATED | : May 31, 2022 | |
| INVENTOR(S) | : Chih-Yao Kuo et al. | |

It is certified that error appears in the above-identified patent and that said Letters Patent is hereby corrected as shown below:

On the Title Page

Item (73), Assignee should read:
HTC Corporation, Taoyuan City (TW)

Signed and Sealed this
Third Day of October, 2023

Katherine Kelly Vidal
*Director of the United States Patent and Trademark Office*